June 7, 1960 YASUO NANNICHI 2,940,023

TRANSISTOR

Filed Sept. 2, 1958

INVENTOR
Y. NANNICHI
BY R P Morris
ATTORNEY

United States Patent Office 2,940,023

Patented June 7, 1960

2,940,023

TRANSISTOR

Yasuo Nannichi, Tokyo, Japan, assignor to International Standard Electric Corporation, New York, N.Y., a corporation of Delaware Filed Sept. 2, 1958, Ser. No. 758,389

Claims priority, application Japan Mar. 22, 1957

5 Claims. (Cl. 317—235)

This invention relates to a transistor and more particularly to a transistor comprising alloyed junction layers of germanium and silicon, and is a continuation-in-part of application Serial Number 721,307, filed March 13, 1958.

Conventional transistors are made either of germanium or silicon, and therefore, the operating characteristics of such transistors are determined largely by the properties of the particular material. For example, it is known that silicon has a relatively wide energy band gap and therefore, has high impedance and low current. Germanium has a relatively small energy band gap, hence low impedance and relatively high current. A transistor made from either of these materials, therefore, is limited in its application by the inherent characteristics of the material.

It is an object of this invention to provide a transistor comprising alloyed junction layers of germanium and silicon, and electrodes so disposed as to obtain the desired characteristics from each material.

In accordance with an aspect of the invention, there is provided a transistor comprising a silicon body having a given type of conductivity. An output electrode is connected to one surface of this body and a layer of silicon of opposite conductivity is fused to another surface. A control electrode is connected to this layer of silicon. A layer of germanium, having the same type conductivity as the silicon body, is fused to the layer of silicon, but spaced from the second electrode; and an input electrode is connected to the germanium layer, whereby the input circuit includes the germanium layer and is of lower inherent resistance than the output circuit.

The above-mentioned and other features and objects of this invention will become apparent by reference to the following description taken in conjunction with the accompanying drawings, wherein.

Figure 1:
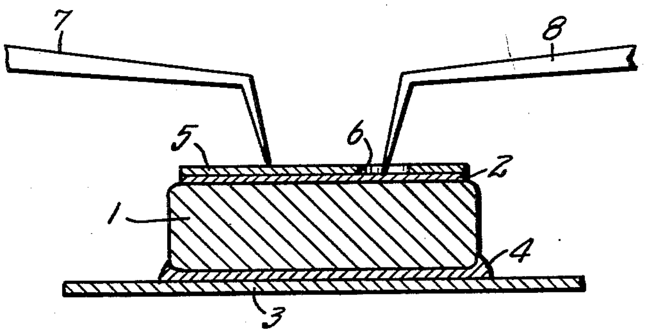
Figure 1 is a cross-sectional view of the novel transistor.

Referring to the figures, the transistor comprises a silicon body having, for example, an N-type conductivity. The conductivities of the other materials making up the transistor are, of course, related to the conductivity of the main body 1. The description of the remaining materials therefore is based on the assumption that the silicon body 1 is of N-type conductivity. If the silicon body 1 were of P-type conductivity, then the other materials of the transistor would have conductivities opposite to those specified herein.

A layer of silicon 2 of P-type conductivity, having a thickness of approximately 10 microns is fused to form an alloy junction with one surface of the silicon body 1. The P-type impurity in the layer 2 may be any of the well known acceptor type impurities, but is preferably aluminum.

A collector electrode 3 is connected to the opposite surface of the silicon body 1. The collector electrode is preferably of the low ohmic, large area type. The collector electrode may be made from any of the well known electrode materials. One preferred material is an alloy of 20% nickel, 70% cobalt, .2% manganese and the balance iron, known by the trademark name "Kovar." "Kovar" is preferred because the coefficient of thermal expansion is approximately equal to that of silicon. The collector electrode may be soldered, as shown at 4, to the silicon body 1, using a gold-antimony solder. It is known that gold adheres well to silicon and a small amount of antimony lowers the melting point of the alloy.

Figure 2:
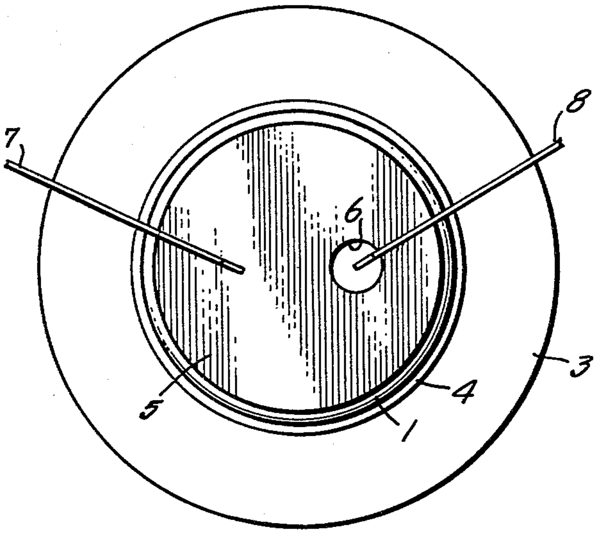
Figure 2 is a plan view of the transistor.

A layer of N-type germanium 5, approximately 10 microns in thickness, is fused to form an alloy junction with the silicon layer 2. As shown in Figure 2, the germanium layer 5 is formed with an aperture 6 so that a portion of the P-type silicon layer is exposed.

The techniques required for applying the silicon and germanium layers are well known in the art and constitute no part of the present invention.

By way of example, the crystal body 1, being of N-type silicon, is first etched with a suitable etching solution such as HF and $HNO_3$, washed with water and then dried. The crystal body is then placed in a quartz crucible with a piece of aluminum. The crucible is then placed in an oven having an inert atmosphere and heated at a temperature of 1100°–1350° C. for a period dependent upon the temperature. A temperature of 1200° C. for approximately one hour is suitable. The pressure inside the oven is atmospheric.

The vaporization of the aluminum on the surface of the N-type crystal produces a P-layer surrounding the crystal. Unwanted portions of this P-layer are removed by the etching treatment discussed above, leaving only one surface of the crystal 1 covered with a layer 2.

The aperture 6 in the germanium layer 5 may be formed by placing a mask on the P-layer 2. The mask may be made of "Kovar." The remaining part of the crystal body may be coated with wax or lacquer for preventing the deposition of germanium thereon.

After the germanium is applied to the layer 2 and the crystal cleaned of the wax and "Kovar," the unit is heat treated in an atmosphere of inert gas at a temperature of 1200° C. for approximately one hour. This heat treatment produces an interfacial diffusion between the germanium and silicon layers.

Assuming the conductivities as described above, the transistor is provided with an emitter electrode 7, preferably a point contact electrode consisting of a gold-antimony alloy, connected to the germanium layer 5.

A base electrode 8, also preferably a point contact electrode made of aluminum, is connected to the exposed surface of the P-type silicon layer 2.

Electrically, the input circuit comprises the germanium layer 5 whereas the output circuit consists only of the silicon materials. This arrangement of semiconductor materials provides a transistor having high collector impedance, therefore low collector current, and extreme temperature stability. These are advantages of a silicon transistor as compared with the germanium transistor.

Moreover, the disadvantage of a silicon transistor, of low emitter efficiency, is overcome by this invention because the emitter electrode is in contact with the germanium layer. Still further, in view of the greater impedance in the output circuit composed of silicon materials, the power gain of the transistor is improved.

While I have described above the principles of my invention in connection with a specific arrangement of materials, it is to be clearly understood that this description is made only by way of example and not as a limitation to the scope of my invention as set forth in the objects thereof and in the accompanying claims.

What is claimed is:

1. A transistor comprising a silicon body having a given type of conductivity, a first electrode connected to a surface of said body, a layer of silicon alloyed to another surface of said body and having an opposite type of conductivity, a second electrode connected to said layer of silicon, a layer of germanium having the same type conductivity as said body alloyed to said layer of silicon and spaced from said second electrode, and a third electrode connected to said germanium layer.

2. The transistor according to claim 1, wherein said body of silicon comprises N-type material and said layers of silicon and germanium comprise P and N type materials respectively.

3. The transistor according to claim 2, wherein said first, second and third electrodes comprise collector, base and emitter electrodes, respectively.

4. The transistor according to claim 1, wherein each of said layers of silicon and germanium are approximately 10 microns in thickness.

5. The transistor according to claim 3, wherein said emitter and base electrodes comprise point contact electrodes and said collector electrode is a large area, low ohmic type electrode.

References Cited in the file of this patent

UNITED STATES PATENTS

| | | |
|---|---|---|
| 2,794,846 | Fuller | June 4, 1957 |
| 2,842,831 | Pfann | July 15, 1958 |